United States Patent [19]
Cole, Jr. et al.

[11] Patent Number: 6,031,386
[45] Date of Patent: Feb. 29, 2000

[54] APPARATUS AND METHOD FOR DEFECT TESTING OF INTEGRATED CIRCUITS

[75] Inventors: Edward I. Cole, Jr., Albuquerque; Jerry M. Soden, Placitas, both of N. Mex.

[73] Assignee: Sandia Corporation, Albuquerque, N. Mex.

[21] Appl. No.: 08/962,465

[22] Filed: Oct. 31, 1997

[51] Int. Cl.$^7$ .................................................. G01R 31/26
[52] U.S. Cl. ........................................ 324/765; 324/158.1
[58] Field of Search ............................... 324/73.1, 158.1, 324/765, 103 R, 758; 714/724, 733, 25

[56] References Cited

U.S. PATENT DOCUMENTS

| | | | |
|---|---|---|---|
| 4,646,299 | 2/1987 | Schinabeck et al. | 324/73.1 |
| 4,710,704 | 12/1987 | Ando | 324/103 R |
| 5,392,293 | 2/1995 | Hsue | 324/765 |
| 5,430,305 | 7/1995 | Cole, Jr. | 250/559.07 |
| 5,519,333 | 5/1996 | Righter | 324/765 |
| 5,523,694 | 6/1996 | Cole, Jr. | 324/751 |
| 5,731,700 | 3/1998 | McDonald | 324/158.1 |
| 5,917,331 | 6/1999 | Persons | 324/765 |

OTHER PUBLICATIONS

J. M. Soden, C. F. Hawkins, R. K. Gulati, and W. Mao, "$I_{DDQ}$ Testing: A Review," *Journal of Electronic Testing*, vol. 3, pp. 291–303, 1992. (No Month Available).

K. M. Wallquist, A. W. Righter, and C. F. Hawkins, "A General Purpose $I_{DDQ}$ Measurement Circuit," Proceedings of the IEEE International Test Conference 1993, paper No. 31.3, pp. 642–651, 1993. (No Month Available).

K. M. Wallquist, "On the Effect of $I_{SSQ}$ Testing in Reducing Early Failure Rate," Proceedings of the IEEE International Test Conference 1995, paper No. 38.3, pp. 910–915. (No Month Available).

K. Isawa and Y. Hashimoto, "High–Speed $I_{DDQ}$ Measurement Circuit," Proceedings of the IEEE International Test Conference 1996, paper No. 5.2, pp. 112–117, 1996. (No Month Available).

A. W. Righter, J. M. Soden, and R. W. Beegle, "High Resolution $I_{DDQ}$ Characterization and Testing—Practical Issues," Proceedings of the IEEE International Test Conference 1996, paper No. 9.3, pp. 259–268, 1996. (No Month Available).

J. F. Plusquellic, D. M. Chiarulli, and S. P. Levitan, "Digital Integrated Circuit Testing using Transient Signal Analysis," Proceedings of the IEEE International Test Conference 1996, paper No. 18.1, pp. 481–490, 1996. (No Month Available).

(List continued on next page.)

*Primary Examiner*—Josie Ballato
*Assistant Examiner*—Minh Tang
*Attorney, Agent, or Firm*—John P. Hohimer

[57] ABSTRACT

An apparatus and method for defect and failure-mechanism testing of integrated circuits (ICs) is disclosed. The apparatus provides an operating voltage, $V_{DD}$, to an IC under test and measures a transient voltage component, $V_{DDT}$, signal that is produced in response to switching transients that occur as test vectors are provided as inputs to the IC. The amplitude or time delay of the $V_{DDT}$ signal can be used to distinguish between defective and defect-free (i.e. known good) ICs. The $V_{DDT}$ signal is measured with a transient digitizer, a digital oscilloscope, or with an IC tester that is also used to input the test vectors to the IC. The present invention has applications for IC process development, for the testing of ICs during manufacture, and for qualifying ICs for reliability.

45 Claims, 3 Drawing Sheets

OTHER PUBLICATIONS

T. W. Williams, R. H. Dennard, R. Kapur, M. R. Mercer, and W. Maly, "Iddq Test: Sensitivity Analysis of Scaling," Proceedings of the IEEE International Test Conference 1996, paper No. 29.3, pp. 786–792, 1996. (No Month Available).

J. M. Soden and R. E. Anderson, "IC Failure Analysis: Techniques and Tools for Quality and Reliability Improvement," *Proceedings of the IEEE*, vol. 81, pp. 703–715, May 1993.

J. S. Beasley, H. Ramamurthy, J. Ramirez–Angulo, and M. DeYong, "$I_{DD}$ Pulse Response Testing of Analog and Digital CMOS Circuits," Proceedings of the IEEE International Test Conference 1993, paper No. 31–1, pp. 626–634, 1993. (No Month Available).

V. Stapjakova, J. Vutas, and H. Manhaeve, "Detecting CMOS Failures Applying Transient Power Supply Current Monitoring," *Proceedings of the European Test Workshop*, 1997. (No Month Available).

6,031,386

APPARATUS AND METHOD FOR DEFECT TESTING OF INTEGRATED CIRCUITS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to the analysis of integrated circuits (ICs) for defects, and in particular to an apparatus and method for determining the presence of defects and failure mechanisms, if any, in one or more ICs by measuring a transient voltage component ($V_{DDT}$) of an operating voltage ($V_{DD}$) of each IC.

BACKGROUND OF THE INVENTION

Failure analysis methods are essential for developing, manufacturing, and qualifying ICs. Many different types of failure analysis methods are available for locating and identifying defects and failure mechanisms in ICs to aid in IC process development, to aid in the manufacture of ICs, and to qualify ICs as being substantially defect-free for reliability assurance. Pinpointing of different types of defects and failure mechanisms in an IC generally requires the use of different analytical methods, since each analytical method has certain advantages and disadvantages. A general review of failure analysis methods can be found in an article entitled, "IC Failure Analysis: Techniques and Tools for Quality and Reliability Improvement," by J. M. Soden and R. E. Anderson, *Proceedings of the IEEE*, Vol. 81, pp. 703–715 (1993). Additionally, the detection of defects and failure mechanisms in ICs becomes increasingly difficult as each succeeding generation of ICs becomes more complex with reduced feature sizes, reduced conductor line widths, and an increased number of interconnecting layers. As a result, there is a continuing need for the development of new and improved IC failure analysis apparatus and methods.

One particular IC failure analysis method, applicable to the testing of complementary metal-oxide semiconductor (CMOS) ICs, is quiescent power supply current ($I_{DDQ}$) testing. This method, which has been used for many years and is receiving wider acceptance in the industry, is disclosed in a review article entitled, "$I_{DDQ}$ Testing: A Review," by J. M. Soden, C. F. Hawkins, R. K. Gulati and W. Mao, *Journal of Electronic Testing: Theory and Applications*, Vol. 3, pp. 291–303 (1992). The $I_{DDQ}$ method is also disclosed in U.S. Pat. No. 5,519,333 to Righter, which is incorporated herein by reference.

$I_{DDQ}$ testing is based on the principle that CMOS ICs are designed to provide a very small quiescent power supply current drain due to leakage that is on the order of about 100 nanoamperes (nA), depending on the level of complexity of the particular IC. In a quiescent state, all circuit nodes in a CMOS IC have voltages that are settled to steady state levels, with a logical high level (i.e. a "1" state) typically being at the power supply voltage level. When a logic transition occurs in the IC due to an applied input voltage, there is a momentary period of time (generally less than about one microsecond) during which complementary n-type and p-type transistors in a plurality of gates within the IC are switched, resulting in a momentary large current drain on the power supply. The transient current (denoted $I_{DDT}$) during this brief time can be up to hundreds of milliamperes (mA) or more. Within this transient switching time period, some of the transistors will be switched on and their complementary transistors switched off. After this, the current from the power supply will again settle down to the $I_{DDQ}$ level.

The presence of a defect (e.g. a gate-to-source oxide electrical short circuit) in a transistor in the CMOS IC can be determined from a measurement of the quiescent current, $I_{DDQ}$, using measurement circuitry placed in line with the power supply connection to the IC since activation of the transistor containing the short circuit will result in an increase in the quiescent current, $I_{DDQ}$. In order to activate a portion (or ideally all) of the transistors in the IC to assess its reliability, a set of test vectors corresponding to different logical inputs to the IC are used. By measuring the quiescent current, $I_{DDQ}$, as each vector in the set of test vectors is provided to the IC (i.e. toggling of the IC) and comparing the measured $I_{DDQ}$ signals to results from a known-good IC (i.e. a defect-free IC), the presence of any defects in the IC being tested can be ascertained.

A disadvantage of the $I_{DDQ}$ failure analysis method is that it requires that analog measurement circuitry be provided in line with the power supply current connection to the IC. The analog measurement circuitry must generally be capable of measuring quiescent currents of less than one microampere ($\mu$A) at clock rates of tens of kHz or more. The same measurement circuitry must be capable of passing the orders of magnitude larger transient current, $I_{DDT}$, during switching transients wherein the logic states in the IC are switched in response to the set of applied test vectors. As the complexity (i.e. the number of transistors) in an IC increases with each new generation of ICs, both the quiescent current, $I_{DDQ}$, and the transient current, $I_{DDT}$, increase, placing additional demands on the measurement circuitry.

An advantage of the defect testing apparatus and method of the present invention is that an increased measurement sensitivity can be achieved for analyzing one or more ICs by measuring a transient voltage component ($V_{DDT}$) of the operating voltage ($V_{DD}$) of the IC as compared to current measurements using the conventional $I_{DDQ}$ method. $V_{DDT}$ signals obtained using the apparatus and method of the present invention can be up to several orders of magnitude more sensitive than current signals measured for the same IC by the $I_{DDQ}$ method.

Another advantage of the present invention is that measurement sensitivity is substantially unaffected by the complexity of the ICs to be tested. This is in contrast to $I_{DDQ}$ testing which can become increasingly difficult as the complexity of the ICs to be tested increases.

A further advantage of the present invention is that no measurement circuitry must be placed in-line with the electrical connection between the power supply source and the IC to be tested. This can simplify electrical interconnections to the IC, and increase testing throughput.

Still another advantage of the present invention is that a wider range of IC designs are testable since the ICs need not be expressly designed for $I_{DDQ}$ testability.

These and other advantages of the method of the present invention will become evident to those skilled in the art.

SUMMARY OF THE INVENTION

The present invention relates to an apparatus and method for defect and failure-mechanism testing of an integrated circuit (IC). The apparatus comprises a source connected to a power supply pin or terminal of the IC to provide an operating voltage thereto; means connected to a plurality of input pins or terminals of the IC for providing a vector set of voltage inputs to the IC for toggling the IC between logic states thereof; and means connected to the power supply terminal of the IC for measuring a transient voltage component, $V_{DDT}$, of the operating voltage generated in response to the toggling of the IC between logic states thereof, with the transient voltage component providing an indication of any defects and/or failure mechanisms present within the IC.

The source for powering the IC can be either a voltage source or a current source. In embodiments of the invention wherein the source is a voltage source, a constant voltage source is preferred. In embodiments of the invention wherein the source is a current source, a constant current source is preferred. Furthermore, the constant current source can be set to provide more current to the IC than required for a defect-free IC.

The means for providing the vector set of voltage inputs to the IC can comprise a switch matrix, or preferably an integrated circuit tester. The means for measuring the transient voltage component, $V_{DDT}$, can comprise a transient digitizer, a digital oscilloscope, or an integrated circuit tester. The means for measuring the transient voltage component, $V_{DDT}$, can measure either an amplitude or a time delay of the transient voltage component, $V_{DDT}$. Additionally, the means for measuring the transient voltage component of the operating voltage can include means for repeatedly measuring and averaging the transient voltage component in response to cycling of the means for providing the vector set of voltage inputs to the IC. The means for measuring the transient voltage component of the operating voltage can further include an amplifier, preferably an alternating-current (ac) amplifier.

The method of the present invention according to some embodiments thereof includes steps for providing an operating voltage, $V_{DD}$, to the IC; toggling the IC between logic states thereof by providing a vector set of voltage inputs to input pins of the IC; measuring a transient voltage component, $V_{DDT}$ of the operating voltage generated in response to toggling of the IC between logic states thereof; and identifying ICs having defects or failure mechanisms therein by determining whether the transient voltage component, $V_{DDT}$, exceeds a known value. The known value can be derived from measurements of one or more defect-free ICs using the present invention, or derived from numerical modeling of electrical characteristics of the IC (i.e. from modeling of a design for the IC).

In other embodiments of the present invention, the method comprises steps for providing an operating voltage, $V_{DD}$, to the IC; toggling the IC between logic states thereof by providing a vector set of voltage inputs to input pins of the IC; measuring a time delay in a transient voltage component, $V_{DDT}$, of the operating voltage generated in response to toggling of the IC between logic states thereof; and identifying ICs having defects or failure mechanisms therein by determining whether the time delay exceeds a known value of time delay. The method of the present invention can further include a step for filtering the transient voltage component, $V_{DDT}$. In these embodiments of the present invention, the known value of time delay can be derived from measurements of one or more defect-free ICs using the present invention, or derived from numerical modeling of electrical characteristics of the IC.

The step for measuring the transient voltage component, $V_{DDT}$, can further include a step for filtering the transient voltage component. Additionally, the step for measuring the transient voltage component, $V_{DDT}$, can include a step for amplifying the transient voltage component, preferably using an ac amplifier.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
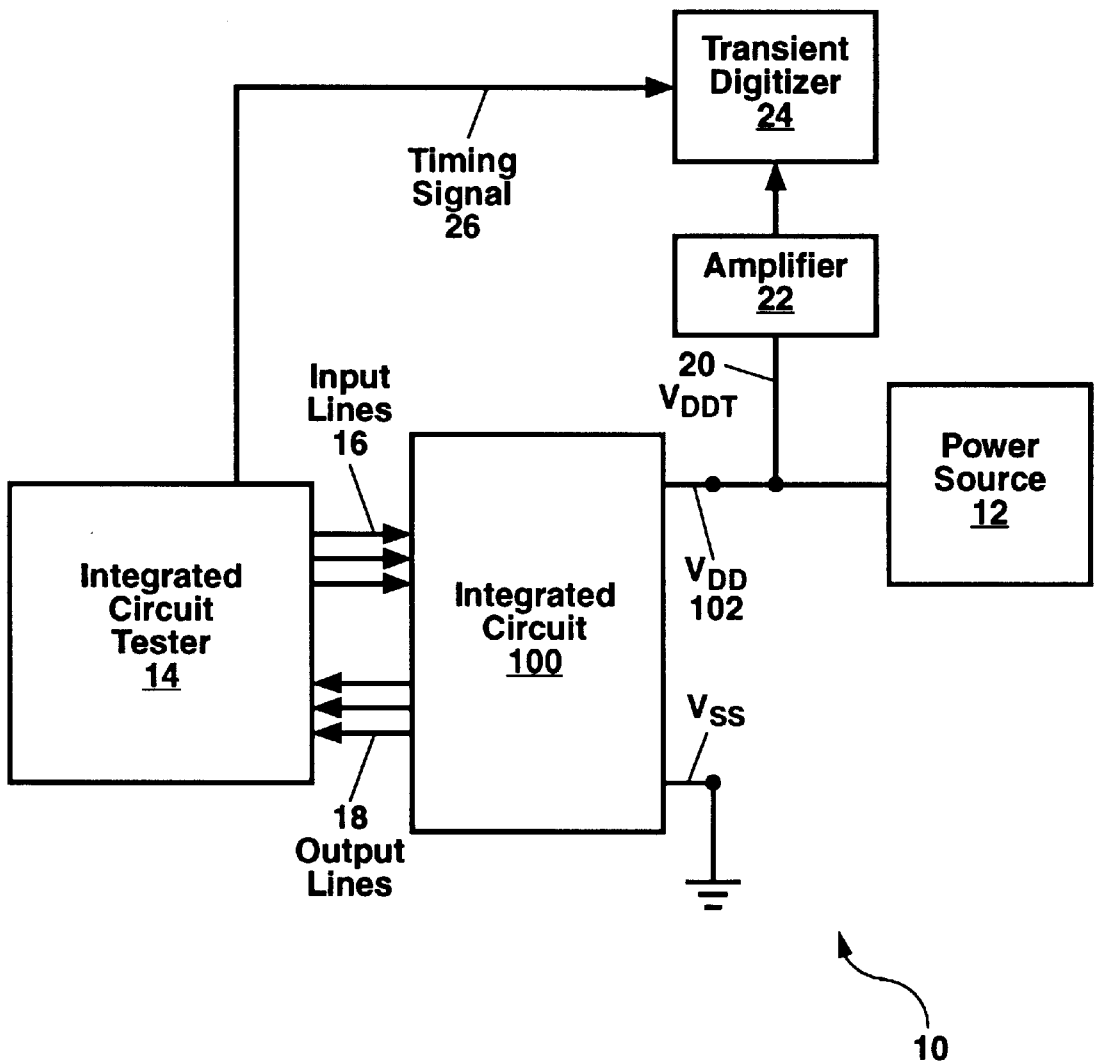
FIG. 1 shows a schematic diagram of the IC defect-testing apparatus of the present invention.

Referring to FIG. 1, there is shown a schematic diagram of an embodiment of the IC defect-testing apparatus 10 of the present invention. In FIG. 1, the apparatus 10 comprises a power supply or source 12 that supplies electrical power to an integrated circuit 100 to be tested via an electrical connection to a power supply pin or terminal 102 of the IC. The power supply terminal 102 is indicated by convention as $V_{DD}$ which also represents the operating voltage of the IC 100. The apparatus 10 further comprises means connected to a plurality of input pins or terminals of the IC 100 for providing a predetermined test vector set of voltage inputs (also termed vector set) to the IC 100 for toggling the IC 100 between logic states thereof; and means connected to the power supply terminal 102 of the IC 100 for measuring a transient voltage component, $V_{DDT}$, of the operating voltage, $V_{DD}$, that is generated in response to toggling of the IC between logic states thereof. A test vector is defined herein as a predetermined sequence of logic state input voltages provided to the input pins of the IC 100 for programming the IC 100 to perform a specific function, or to activate selected transistor gates within the IC 100. The transient voltage component, $V_{DDT}$, is used to provide an indication of any defects present within each IC 100 being tested by the apparatus 10, and in particular defects that alter an electrical current to the IC 100.

The means for providing the vector set to the IC 100 under test can be a switch matrix or an integrated circuit tester 14 (also termed a production tester) as shown in the embodiment of the present invention in FIG. 1. The means for measuring the transient voltage component, $V_{DDT}$, can be a transient digitizer 24 as shown in the embodiment of the present invention in FIG. 1. In other embodiments of the present invention, the means for measuring the transient voltage component, $V_{DDT}$, can be a digital oscilloscope, or even the IC tester 14. As shown in FIG. 1, a timing signal 26 can be provided by the IC tester 14 for triggering the transient digitizer 24 for measuring the transient voltage component, $V_{DDT}$, or for use in measuring a time delay of the $V_{DDT}$ signal. An optional amplifier 22, preferably an alternating-current (ac) coupled amplifier, can be used to amplify the $V_{DDT}$ signal prior to measurement.

In FIG. 1, the IC tester 14 provides the test vector set to the IC 100 via a plurality of input lines 16 connected to the voltage input pins of the IC, and also preferably reads out the logic states of the IC 100 via a plurality of output lines 18 connected to the voltage output pins of the IC. The test comprises a limited number of test vectors selected to test representative or critical elements or gates in the IC 100 (e.g. to verify processing parameters). Toggling of the IC 100 as this term is used herein refers to sequentially providing the set of test vectors as inputs to the IC 100 in response to clocking of the IC 100 at a predetermined clock rate.

In using the present invention, it is generally not desirable to individually test every transistor gate in the IC 100 for defects or failure mechanisms. This is especially the case in a production environment where the goal is to qualify large numbers of ICs as being substantially free of defects or failure mechanisms, while minimizing the time required for testing. The set of test vectors can be determined from the design of a particular IC 100, and an exact set of test vectors can vary depending on whether the apparatus 10 is to be used for production testing, or for failure analysis.

In FIG. 1, a transient voltage signal component (termed $V_{DDT}$) 20 of the operating voltage, $V_{DD}$, can be measured with the apparatus 10 to provide an indication of defects, if any, in the IC 100. The origin of the $V_{DDT}$ signal 20 can be understood with reference to FIG. 2.

Figure 2A:
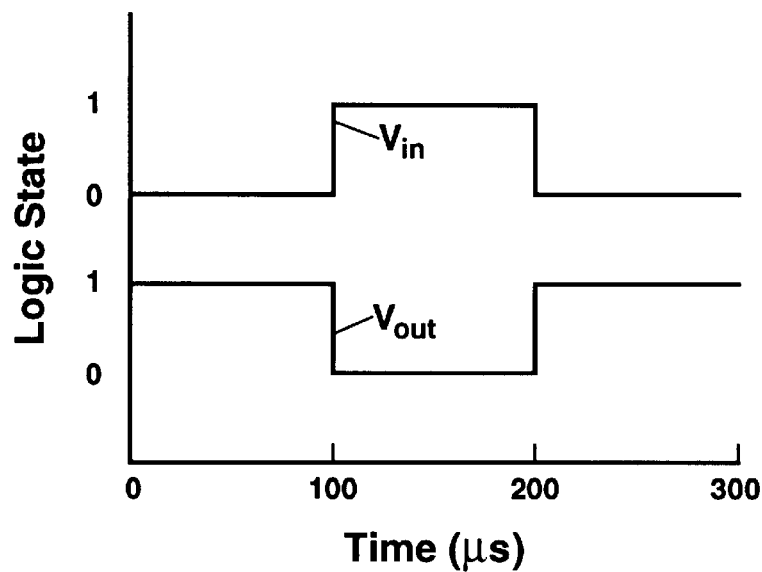
FIG. 2a shows schematically input and output logic states of a transistor gate of an IC operating at a clock rate of 10 kHz.

FIG. 2a shows schematically the logic state for a transistor gate within the IC 100 formed by a complementary pair of transistors. The logic state of the transistor gate can change in response to an input voltage, $V_{in}$, provided to the gate. As the input voltage, $V_{in}$, is switched from a logical low state (i.e. a "0" state) to a logical high state (i.e. a "1" state) at a clock rate (in this case 10 kHz), the logic state of the output of the transistor gate is switched from a "1" state to a "0" state. In the IC 100, a large number of such gates can switch simultaneously as the input voltage, $V_{in}$, to one or more input pins of the IC 100 is switched. The aggregate switching of a large number of logic gates can result in a large transient current drain on the power source 12 of hundreds of milliamperes or more. If the power source 12 in FIG. 1 were an ideal source which provided a constant output regardless of the current being drawn, then there would be no observable effect on the operating voltage, $V_{DD}$, which would remain constant as indicated by the dashed line in FIG. 2b labelled "Ideal $V_{DD}$".

In actuality, however, the limited responsiveness of the power source 12 results in the operating voltage, $V_{DD}$, being significantly affected by the large transient current drain due to switching of logic states in the IC 100. The result is a transient voltage component, $V_{DDT}$, of the operating voltage, $V_{DD}$, which occurs with each switching transient (i.e. at each change in the input voltage to the IC 100).

$V_{DDT}$ can be measured with respect to the ideal value of the operating voltage, $V_{DD}$, which would be reached at steady state in the absence of any additional switching of logic states in the IC 100, or with respect to a set-point voltage. The transient voltage component (i.e. the $V_{DDT}$ signal) is defined herein as being a time-varying component of the operating voltage, $V_{DD}$, which can extend below, above or both below and above an ideal or set-point value of the operating voltage, $V_{DD}$.

The amplitude of the transient voltage component, $V_{DDT}$, will, in general, depend on the number of logic gates in the IC 100 that are being switched at each logic state transition which can vary depending upon particular test vectors being provided to the IC 100. This accounts for the different amplitudes of the $V_{DDT}$ signals shown in FIG. 2b. Additionally, the amplitude of $V_{DDT}$ is dependent on the presence of any defects and/or failure mechanisms within the IC, since these defects (e.g. short-circuit defects) and failure mechanisms can substantially alter the current drain from the power source 12. As a result, measurements of $V_{DDT}$ for an IC 100 being tested can be compared to similar measurements from one or more known-good ICs of the same type, with the difference in $V_{DDT}$ measurements providing an indication of any defects within the IC 100 being tested. Defective ICs 100 which result in an increased current drain from the power source 12 will produce larger $V_{DDT}$ signals than would be measurable for defect-free ICs.

Alternately, a time-delay method as described hereinafter can be used for defect testing of ICs 100. This time-delay method relies on measurements of a time delay, $\Delta t$, in the $V_{DDT}$ signal from defective ICs 100 relative to the $V_{DDT}$ signal from a defect-free IC 100. In the time-delay method, the $V_{DDT}$ signal 20 in FIG. 1 can be routed to the IC tester 14 for measurement so that the transient digitizer 24 and amplifier 22 are not needed for the apparatus 10. The time-delay method is particularly advantageous for use in a production environment for use in qualifying ICs (i.e. testing a plurality of ICs to cull out any defective ICs). The time-delay method can be understood with reference to FIG. 3 and will be described in detail hereinafter.

A production IC tester 14 can have a timing accuracy of less than one nanosecond for measuring the $V_{DDT}$ signal 20. The timing of the $V_{DDT}$ signal 20 can be measured relative to a clock signal, relative to a voltage input to the IC 100, or relative to an internal timing signal provided within the tester 14. A defective IC 100 can be identified by determining whether the measured time delay, $\Delta t$, in the $V_{DDT}$ signal 20 exceeds a known value of time delay. The known value of time delay can be derived either from measurements of one or more ICs 100 free of defects and failure mechanisms, or from numerical modeling of electrical characteristics of the IC 100 being tested.

Several examples of use of the apparatus and method of the present invention are presented hereinafter. These examples are provided to show the utility of the present invention; and in no way are they intended to limit the invention.

EXAMPLE 1

A comparison was made between the conventional $I_{DDQ}$ method and the $V_{DDT}$ method of the present invention by performing static direct-current (dc) testing of a defect-free and failure-mechanism-free radiation-hardened CMOS version of an Intel 8085 microprocessor IC 100. A constant current power supply 12 was used, with the operating voltage, $V_{DD}$, set at 5 Volts. A particular vector state change that produced a measured change in $I_{DDQ}$ of 271 picoamperes (from 3.911 nA to 4.182 nA) due to a change in the number of operational logic gates in the IC resulted in a measured change in $V_{DD}$ of 91 milliVolts (from 4.9915 V to 4.9009 V). These initial measurements were made over a one-minute stabilization time using a parametric analyzer connected to the IC via the input lines 16 and output lines 18. These measurements show the much larger signal that can be generated according to the present invention by measuring the transient voltage component, $V_{DDT}$, as compared with conventional $I_{DDQ}$ testing.

EXAMPLE 2

Dynamic stimulus vectors can be applied to an IC 100 under test at a predetermined clock rate using an IC tester 14 as shown in FIG. 1. For this example of the present invention, the source 12 powering the IC 100 can be either a current source (preferably a constant current source) or a voltage source (preferably a constant voltage source). A computer-programmable source 12 (e.g. a Keithley Instruments, Model No. 236 power source) is particularly advantageous for computerized operation and programmability of the apparatus 10.

In this example of the present invention, defect testing was performed on a radiation-hardened 78,000 transistor version of an Intel 80C51 microcontroller IC 100. The IC tester 14 of the apparatus 10 was programmed to continuously loop through a selected set of 100 test vectors during $V_{DDT}$ measurements.

A major concern during defect testing was whether the current drawn from the power source 12 would be sufficient to maintain proper logic operation during switching transients. This concern was addressed by operating the power source 12 in a constant current mode with the source 12 being set in an "over-supply" mode so that it can supply far more current to the IC 100 than is required for normal operation in the absence of any defects. In this example, the constant current setting was selected to be 1 mA for the 80C51 IC 100 which had a quiescent current, $I_{DDQ}$, of about 500 pA (picoamperes). A voltage compliance limit for the power source 12 was set to 5 V to prevent any over-voltage damage to the IC 100 under test. It should be noted that the use of the "over-supply" mode mimics a constant voltage source having a limited response time for recovering from the large current drain during switching transients.

The effect of current loading on the power source 12 was characterized by providing a resistive load to ground at a single output pin of the IC 100. When the voltage output for this output pin of the IC 100 was at a logical high state (5 V), the current to ground through the resistive load increases the quiescent current, $I_{DDQ}$, through the IC 100. Reducing the resistance of the load increases the quiescent current, $I_{DDQ}$, to the IC 100 and also increases the $V_{DDT}$ signal 20 measured by the apparatus 10. The resistive load provides a way of simulating a defect in an otherwise defect-free IC in order to measure the change in the $V_{DDT}$ signal 20 between defective and defect-free ICs 100.

Figure 2B:
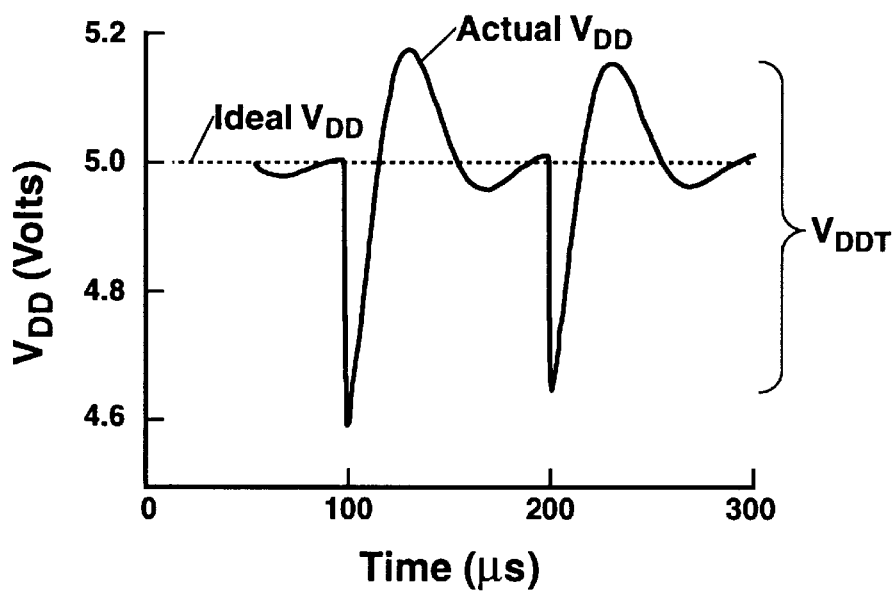
FIG. 2b shows the operating voltage, $V_{DD}$, (dashed curve) from an ideal power source that is insensitive to the switching of the logic states in FIG. 2a, and the operating voltage, $V_{DD}$, (solid line) from an actual power source which includes a transient voltage component, $V_{DDT}$, generated in response to switching transients produced by switching of the logic states of a large number of transistor gates in an IC.

Although testing with a constant current power source 12 showed the apparatus and method of the present invention to be viable, a constant voltage source 12 can also be used. Furthermore, a constant voltage source 12 is generally preferred for use in a production test environment since the constant voltage source 12 can be provided by using an internal power supply of a production tester 14 thereby eliminating the need for a power source 12 that is separate from the production tester 14. FIG. 2b shows measurements of the $V_{DDT}$ signal 20 for the defect-free 80C51 IC (i.e. without the resistive load connected to the output pin of the IC 100) at a clock rate of 10 kHz.

EXAMPLE 3

In this example of the present invention, a radiation-hardened Intel 80C51 microcontroller IC 100 was tested by cycling through a set of test vectors at a 1 MHz clock rate using a constant voltage source 12 with a current set limit of 1 mA. To simulate a defect or failure-mechanism within an IC 100 that is otherwise free of any defects or failure-mechanisms, a resistive load was connected between a particular output pin of the IC 100 and ground. The simulated defect can be activated in the 80C51 IC 100 by providing a test vector which switches this output pin from a logical low state (0 V) to a logical high state (5 V). In the logical low state, no current is drawn through the load resistor; whereas in the logical high state, a 100 $\mu$A (microampere) load current is drawn by the resistor, and this load current must be provided by the power source 12 in addition to the quiescent current required by the 80C51 IC 100.

Figure 3:
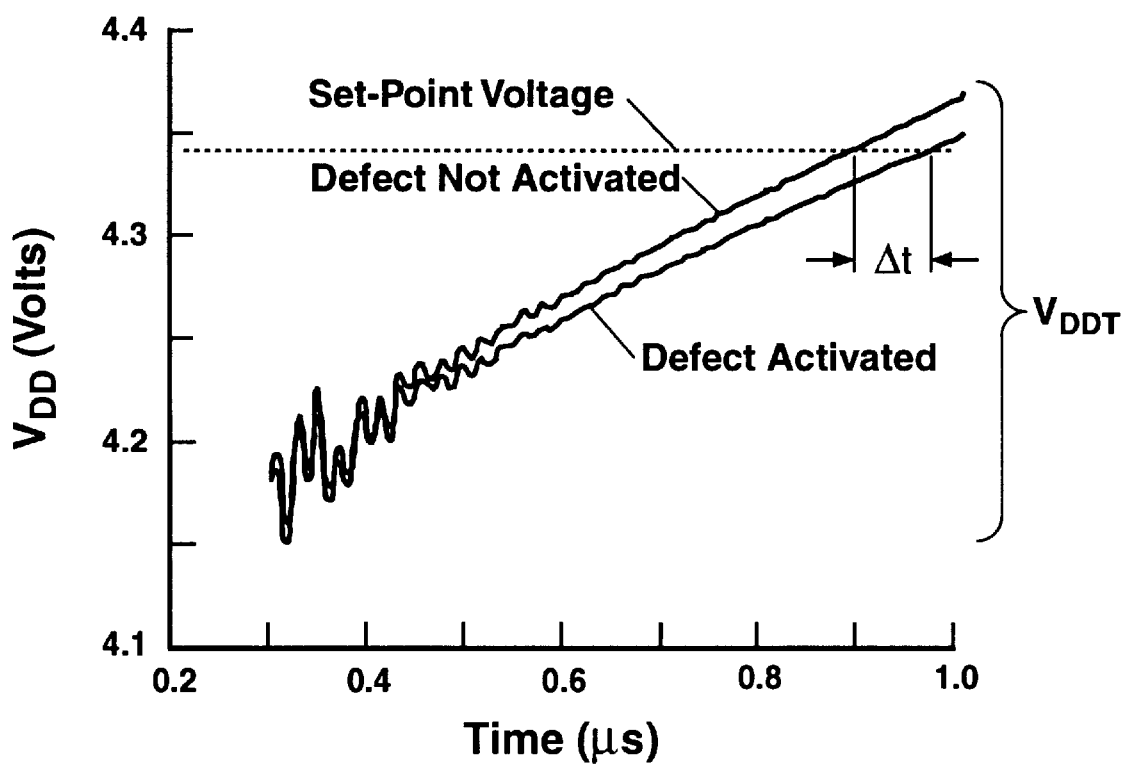
FIG. 3 shows, a set-point voltage (dashed curve) and $V_{DDT}$ signals (solid curves) for an IC with and without activation of a simulated defect therein.

The dashed curve in FIG. 3 shows a set-point voltage which is defined as the voltage attained by the power source 12 after 95% of a clock cycle (i.e. 950 ns after the switching transition for a 1 MHz clock rate) has passed. The solid curves in FIG. 3 show the transient voltage component, $V_{DDT}$, of the operating voltage, $V_{DD}$, from the constant voltage source 12 actually used for these measurements. In FIG. 3, activation of the simulated defect in the 80C51 IC 100 results in the $V_{DDT}$ signal 20 being delayed in time by an amount, $\Delta t$, relative to the $V_{DDT}$ signal 20 in the absence of the defect.

The time delay, $\Delta t$, results from an increased current drain on the power source 12 due to the resistive load; and this increases the time needed by the power source 12 to "recover" after the switching transient and reach the set-point voltage. In FIG. 3, although the time delay, $\Delta t$, is measured at the point at which the $V_{DDT}$ curve intersects the set-point voltage, the time delay could be measured when the $V_{DDT}$ curves reach any predetermined voltage near $V_{DD}$. Furthermore, the time delay is preferably measured after the ringing on the $V_{DDT}$ curves in FIG. 3 has decayed (e.g. after about 0.7 $\mu$s in FIG. 3).

It should also be noted that the time delay, $\Delta t$, separating the two $V_{DDT}$ curves in FIG. 3 increases with time after the switching transient so that it is generally easier to measure $\Delta t$ at longer times from the switching transient (i.e. near the set-point voltage in FIG. 3). Measurement accuracy can also be increased by repeatedly cycling through the set of test vectors a predetermined number of times, and averaging the $V_{DDT}$ signals 20 measured by the IC tester 14, or by the transient digitizer 24, or by a digital oscilloscope, whichever is used for measuring the $V_{DDT}$ signals 20.

Measurements with different load currents (simulating different types or numbers of defects in an 80C51 IC 100) showed that the delay time, $\Delta t$, was nearly linear in current for load currents in the range of about 2 to 100 $\mu$A. Furthermore, the delay time, $\Delta t$, is largest for low clock rates (e.g. 20 kHz), and decreases with increasing clock rate. The measured dependence of the delay time per $\mu$A of load current is shown in Table 1. The measurement sensitivity that can be achieved at a particular clock frequency will also depend upon the resolution or accuracy with which the time delay, $\Delta t$, can be measured. For example, if the time delay is measured with a 700 ps accuracy which is possible with an IC tester 14, then the time-delay method of the present invention should be able to measure an increased load current (due to activation of a defect within the IC 100) with an accuracy of about 4 nA at a 20 kHz clock rate. The measurement accuracy is reduced with increasing clock rate to about 20 nA at 100 kHz and about 1 μA at 1 MHz.

TABLE 1

| Clock Frequency (MHz) | Time Delay/ Load Current (ns/μA) |
|---|---|
| 0.02 | 169.7 |
| 0.1 | 35.5 |
| 0.3 | 7.53 |
| 0.5 | 2.41 |
| 0.7 | 1.32 |
| 0.9 | 0.859 |
| 1.0 | 0.703 |
| 1.1 | 0.614 |
| 1.3 | 0.390 |
| 1.5 | 0.273 |

The change in delay time with load current was found to depend upon the particular constant voltage source 12 used and the current limit selected for the source 12, indicating that the $V_{DDT}$ signal 20 is sensitive to impedance matching between the source 12 and the IC 100 being tested. The change in delay time with defect load current was found to be substantially independent of the wafer lot from which a particular IC 100 was selected. This was shown by performing measurements on radiation-hardened Intel 80C51 microcontroller ICs 100 from three different manufacturing sources. Each 80C51 IC 100 tested showed nearly identical results in the dependence of delay time, Δt, on defect load current. Additionally, the change in time delay, Δt, with defect load current was found to be substantially independent of the quiescent current, $I_{DDQ}$, drawn by a particular 80C51 IC 100. This was shown with measurements of a defective 80C51 IC 100 which had a quiescent current of 330 μA. Measurements of this defective IC 100 required that the set-point voltage be lowered compared to that in FIG. 3; but otherwise the defective 80C51 IC 100 showed the same dependence of time delay on load current as the other ICs above.

EXAMPLE 4

A CMOS static random access memory (SRAM) IC 100 having an elevated-current defect was tested with the apparatus and time-delay method of the present invention and compared to a defect-free IC 100 of the same type. The quiescent current, $I_{DDQ}$, in the defective CMOS SRAM IC 100 was 16.96 μA compared with 680 nA in the defect-free IC 100. The constant voltage power source 12 used in the apparatus 10 for testing of these ICs 100 was set at 5 V supply voltage, 0.6 mA current limit, and a 1 mA current range. Time delay measurements were made with the apparatus 10 at clock frequencies of 50–400 kHz for toggling the set of test vectors inputted to the IC 100 by the IC tester 14; and the time delay represented the difference in response of the $V_{DDT}$ signals 20 at the set-point voltage between the defective and defect-free ICs. The results of these time-delay measurements are shown in Table 2.

In analyzing a quantity of ICs 100 to select between defective and defect-free

TABLE 2

| Clock Frequency (kHz) | Time Delay (ns) |
|---|---|
| 50 | 3600 |
| 100 | 1079 |
| 200 | 230 |
| 300 | 160 |
| 400 | 36 |

ICs, the apparatus and method of the present invention can be used in several different ways. For example, defective ICs 100 can be identified as those ICs 100 for which the time delay, Δt, exceeds a known value. As another example, the transient voltage component, $V_{DDT}$, can be measured for each IC 100 being tested at a predetermined instant in time and compared to a known or set value of $V_{DDT}$. If $V_{DDT}$ is below the known value, then the IC 100 is identified as being defective; and if $V_{DDT}$ is above the known value, then the IC 100 is identified as being defect-free. The known or set value of $V_{DDT}$ can be determined from measurements of one or more known good (i.e. defect-free) ICs, or from modeling of electrical characteristics of the type of IC 100 being tested.

The matter set forth in the foregoing description and accompanying drawings is offered by way of illustration only and not as a limitation. Other applications and variations of the apparatus and method for defect testing of ICs will become evident to those skilled in the art. The actual scope of the invention is intended to be defined in the following claims when viewed in their proper perspective based on the prior art.

What is claimed is:

1. An apparatus for defect or failure-mechanism testing of an integrated circuit (IC), comprising:
   (a) a source connected to a power supply terminal of the IC to provide an operating voltage thereto;
   (b) means connected to a plurality of input pins of the IC for providing a vector set of voltage inputs to the IC for toggling the IC between logic states thereof; and
   (c) means connected to the power supply terminal of the IC for measuring a transient voltage component ($V_{DDT}$) generated in response to the toggling of the IC between logic states thereof, with the transient voltage component providing an indication of any defects or failure-mechanisms present within the IC.

2. The apparatus of claim 1 wherein the source comprises a voltage source.

3. The apparatus of claim 2 wherein the voltage source comprises a constant voltage source.

4. The apparatus of claim 1 wherein the source comprises a current source.

5. The apparatus of claim 4 wherein the current source comprises a constant current source.

6. The apparatus of claim 5 wherein the constant current source provides more current to the IC than required for a defect-free IC.

7. The apparatus of claim 1 wherein the means for providing the vector set of voltage inputs to the IC comprises an integrated circuit tester.

8. The apparatus of claim 7 wherein the means for measuring the transient voltage component of the operating voltage is the integrated circuit tester.

9. The apparatus of claim 1 wherein the means for measuring the transient voltage component of the operating voltage is a transient digitizer.

10. The apparatus of claim 1 wherein the means for measuring the transient voltage component of the operating voltage is a digital oscilloscope.

11. The apparatus of claim 1 wherein the means for measuring the transient voltage component of the operating voltage includes an amplifier.

12. The apparatus of claim 11 wherein the amplifier is an alternating-current (ac) amplifier.

13. The apparatus of claim 1 wherein the means for measuring the transient voltage component of the operating voltage includes means for repeatedly measuring and averaging the transient voltage component in response to cycling of the means for providing the vector set of voltage inputs to the IC.

14. The apparatus of claim 1 wherein the vector set of voltage inputs to the IC comprises selected test vectors.

15. The apparatus of claim 1 wherein the IC is a complementary metal-oxide semiconductor (CMOS) IC.

16. A method for testing an integrated circuit (IC) and locating any defects or failure-mechanisms therein, comprising steps for:

(a) providing an operating voltage ($V_{DD}$) to the IC;

(b) toggling the IC between logic states thereof by providing a vector set of voltage inputs to input pins of the IC;

(c) measuring a transient voltage component ($V_{DDT}$) of the operating voltage generated in response to toggling of the IC between logic states thereof; and (d) identifying ICs having defects or failure-mechanisms therein by determining whether the transient voltage component ($V_{DDT}$) exceeds a known value.

17. The method of claim 16 wherein the step for providing the operating voltage is performed by using a constant voltage source.

18. The method of claim 16 wherein the step for providing the operating voltage is performed by using a constant current source.

19. The method of claim 18 further including a step for providing more current to the IC than required for a defect-free and faliure-mechanism-free IC.

20. The method of claim 16 wherein the step for toggling the IC between logic states thereof comprises providing the vector set of voltage inputs with an integrated circuit tester.

21. The method of claim 20 wherein the step for measuring the transient voltage component of the operating voltage comprises measuring the transient voltage component with the integrated circuit tester.

22. The method of claim 16 wherein the step for measuring the transient voltage component of the operating voltage comprises measuring the transient voltage component with a transient digitizer.

23. The method of claim 16 wherein the step for measuring the transient voltage component of the operating voltage comprises measuring the transient voltage component with a digital oscilloscope.

24. The method of claim 16 wherein the step for measuring the transient voltage component of the operating voltage comprises averaging multiple measurements of the transient voltage component.

25. The method of claim 16 wherein the known value is derived from at least one defect-free and failure-mechanism-free IC.

26. The method of claim 16 wherein the known value is derived from modeling electrical characteristics of the IC.

27. The method of claim 16 wherein the step for measuring the transient voltage component further includes a step for amplifying the transient voltage component.

28. The method of claim 27 wherein the step for amplifying the transient voltage component comprises amplifying the transient voltage component with an alternating-current (ac) amplifier.

29. The method of claim 16 wherein the IC is a complementary metal-oxide semiconductor (CMOS) IC.

30. A method for testing an integrated circuit (IC) and locating any defects or failure-mechanisms therein, comprising steps for:

(a) providing an operating voltage ($V_{DD}$) to the IC;

(b) toggling the IC between logic states thereof by providing a vector set of voltage inputs to input pins of the IC;

(c) measuring a time delay in a transient voltage component ($V_{DDT}$) of the operating voltage generated in response to toggling of the IC between logic states thereof; and (d) identifying ICs having defects or failure-mechanisms therein by determining whether the time delay exceeds a known value of time delay.

31. The method of claim 30 wherein the step for providing the operating voltage is performed by using a constant voltage source.

32. The method of claim 30 wherein the step for providing the operating voltage is performed by using a constant current source.

33. The method of claim 32 further including a step for providing more current to the IC than required for a defect-free and failure-mechanism-free IC.

34. The method of claim 30 wherein the step for toggling the IC between logic states thereof comprises providing the vector set of voltage inputs with an integrated circuit tester.

35. The method of claim 34 wherein the step for measuring the time delay comprises measuring the time delay with the integrated circuit tester.

36. The method of claim 30 wherein the step for measuring the time delay comprises measuring the time delay with an integrated circuit tester.

37. The method of claim 30 wherein the step for measuring the time delay comprises measuring the time delay with a transient digitizer.

38. The method of claim 30 wherein the step for measuring the time delay comprises measuring the time delay with a digital oscilloscope.

39. The method of claim 30 wherein the step for measuring the time delay comprises averaging multiple measurements of the time delay.

40. The method of claim 30 wherein the known value of time delay is derived from at least one defect-free and failure-mechanism-free IC.

41. The method of claim 30 wherein the known value of time delay is derived from modeling electrical characteristics of the IC.

42. The method of claim 30 wherein the step of identifying ICs having defects or failure-mechanisms therein further includes a step for qualifying ICs as being defect-free and failure-mechanism-free if the time delay is less than the known value of time delay.

43. The method of claim 30 wherein the step for measuring a time delay in the transient voltage component further includes a step for amplifying the transient voltage component.

44. The method of claim 42 wherein the step for amplifying the transient voltage component comprises amplifying the transient voltage component with an alternating-current (ac) amplifier.

45. The method of claim 30 wherein the IC is a complementary metal-oxide semiconductor (CMOS) IC.

* * * * *